United States Patent [19]

Muller et al.

[11] Patent Number: 5,108,513
[45] Date of Patent: Apr. 28, 1992

[54] DEVICE FOR TRANSPORTING AND POSITIONING SEMICONDUCTOR WAFER-TYPE WORKPIECES

[75] Inventors: Alois Muller, Tann; Helmut Seidl, Burghausen; Erich Wimmer, Stammham; Laszlo Eigner, Kirchdorf, all of Fed. Rep. of Germany

[73] Assignee: Wacker-Chemitronic Gesellschaft fur Elektronik-Grundstoffe mbh, Munich, Fed. Rep. of Germany

[21] Appl. No.: 518,580

[22] Filed: May 3, 1990

[30] Foreign Application Priority Data

Jul. 14, 1989 [DE] Fed. Rep. of Germany ....... 3923405

[51] Int. Cl.⁵ ............................. B08B 1/02
[52] U.S. Cl. ........................... 134/15; 406/87; 406/88; 406/84; 198/394; 414/755
[58] Field of Search .......... 406/84, 86, 87, 88; 198/394, 395; 414/735; 134/15, 26, 34

[56] References Cited

U.S. PATENT DOCUMENTS

| | | | |
|---|---|---|---|
| 3,215,238 | 11/1965 | Ackermann | 406/87 |
| 3,976,329 | 8/1976 | Adams et al. | 406/84 |
| 4,242,038 | 12/1980 | Santini et al. | 414/84 |
| 4,348,139 | 9/1982 | Hassan et al. | 406/84 |
| 4,618,292 | 10/1986 | Judge et al. | 406/84 |

Primary Examiner—Joseph F. Peters, Jr.
Assistant Examiner—Christopher P. Ellis
Attorney, Agent, or Firm—Burgess, Ryan & Wayne

[57] ABSTRACT

A device in which the wafers are moved with the aid of aqueous media, is proposed for the transportation of semiconductor wafers and also for use in processes for the cleaning thereof, the device including a guideplate having a bottom plate with nozzle systems which are differently inclined in each case and independent of one another and through which the transportation fluid is, if necessary, forced into the transportation space, as a result of which the wafer can be loaded, retarded, caused to rotate and unloaded again. The devices can be combined to form treatment lines, different fluids being used in each case in the individual sections thereof, so that no mechanically moving parts act on the wafers during retardation and rotation and that no change of reagents has to be carried out inside a treatment station.

2 Claims, 2 Drawing Sheets

DEVICE FOR TRANSPORTING AND POSITIONING SEMICONDUCTOR WAFER-TYPE WORKPIECES

BACKGROUND OF THE INVENTION

The invention relates to a device for transporting and positioning wafer-type workpieces and, in particular, semiconductor wafers, in which the workpieces are moved, with the aid of fluid media, across a guideplate provided with lateral walls, the media being forced through nozzles, which are arranged in the plate bottom and inclined in the direction of transportation, into a transportation space in which at least one region is provided for retarding and positioning the workpieces. It furthermore relates to a process for the wet-chemical surface treatment of wafer-type workpieces and, in particular, semiconductor wafers, in which one or more liquids are caused to act on the wafer surface and the wafers are subjected to at least one transportation operation by means of fluid media.

A device of the type generally mentioned above is known from DE-B-2,036,337, filed Jul. 22, 1970, claiming priority of U.S. application Ser. No. 844,918, filed Jul. 25, 1969 (Applicant—Texas Instruments Inc.). In that case. pressurized gaseous or, alternatively, liquid media, and normally air, is used as a transportation means. For the purpose of retardation, the workpieces are brought into contact with a retarding surface at a point provided, so that the speed is first reduced by mechanical friction until the wafers come to rest near a specified point and can ultimately be brought into their final position. However, such a contact with retarding surfaces may, in itself, result in an impermissible contamination of the workpieces, and this applies, in particular, to semiconductor wafers on which extremely high cleanliness requirements are imposed by the component manufactures. In addition, this device permits only translational movements of the wafers, but not rotational ones.

EP-B-130,866 and the corresponding U.S. Pat. No. 4,557,785 disclose a further device of this type, in which, after an etching and rinsing treatment by means of nozzles carried out with rotation in an etching station, the wafers are transported through a rinsing bath and eventually transferred to a spin-drier in which adhering water is spun off, so that the dried wafers eventually obtained can then be removed for the next treatment step. Both the introduction of the wafers into the etching station and also the retardation of the wafers on introduction into the spin-drier and the dry spinning are carried out in this case with mechanical aids, so that a contamination of, or damage to, the wafers cannot be ruled out. In addition, the etching station has to be opened in each case to introduce or remove the wafer by mechanically moving its cover, and this, of course, also implies the risk of a contamination due to abrasion. A further disadvantage is that the etching station is loaded alternately with etchant and water, so that an entrainment of reagent residues is possible.

OBJECTS AND SUMMARY OF THE INVENTION

An object of the invention is to provide a device of the type mentioned above, which avoids these disadvantages and makes it possible to transport semiconductor wafers, to stop them, to position them, optionally to cause them to rotate, and to transport them further, without mechanical contact. and also, optionally, to subject the wafers at the same time to one or more wet-chemical treatment and/or cleaning steps. The object is furthermore to provide a suitable designed process comprising such steps.

These objects are achieved by a device wherein retardation nozzles which are arranged in the guideplate at an angle inclined in opposition to the direction of transportation and are supplied with fluid medium at least during the retardation and positioning of a workpiece are provided in the retardation region in the plate bottom. Advantageous developments of the device emerge from the subordinate claims. The process of the type mentioned above, which achieves these objects, is one wherein the wafers pass through at least one such device, the liquid to be caused to act thereon, being used in the device as fluid medium.

Expediently, the guideplate is manufactured from material which is largely inert towards the fluid media used in a particular case and which cannot have any contaminating action with respect to the wafers to be transported either. In the transportation of particularly sensitive wafer-type workpieces such as semiconductor wafers made of silicon, germanium, gallium arsenide or indium phosphide, wafers made of oxidic materials such as gallium gadolinium garnet, sapphire, spinel or glass materials, plastics have proved especially successful, it being possible to also use, in particular, polymethyl methacrylates ("Plexiglass"), polytetrafluoroethylene, polycarbonates, polyvinylidene fluoride, perfluoroalkoxyalkanes, acrylic glazing sheet or similar materials, and glass. The use of transparent or clear materials is advantageous since, in a simple way, they permit the visual monitoring and/or monitoring carried out by means of optical sensors and optionally, also control of the movement of the workpieces or the supply and the removal of the fluid media used. It is also important that the selected material is sufficiently dimensionally stable to make possible a precise and dimensionally true orientation of the nozzles and also an exact surface processing, so that a surface of the bottom of the guideplate, which permits a satisfactory and undisturbed flow fo the fluid and is flat and free of unevenness, can be prepared, for example, by polishing and maintained under operating conditions.

Advantageously, the lateral walls, which prevent the lateral emergence of the fluid, of the guide plate are composed of the same material as the guide plate itself, but this is not mandatory. In those cases in which maximum cleanliness requirements are imposed, they may also be manufactured from the material of which the wafers to be transported are composed. In this manner, the risk of contamination due to abrasion can be kept low since it cannot be completely excluded in general that even in the case of very precisely worked guideplates, the wafers deviate laterally from the ideal direction of transportation and come into contact with the walls, for example, if pressure variations occur in the fluid system. The walls may be detachably joined to the plate bottom, for example, by screw or plug joints or may be permanently joined, for example, by gluing or welding. In general, dimensioning the guideplate in a manner such that, in a particular case, a clear gap of 2 to 50 mm is left between the outside circumference of the wafer to be transported and the walls on both sides has proved successful. These values do not, however, mandatorily have to be observed, for example, in the case of arrangements which are provided for transporting wafers having different diameters.

Finally, the guideplate has the shape of a flat trough having, preferably, a rectangular or trapezoidal cross section, it optionally being possible for the lateral corners to be rounded. Expediently, an upper cover which at least partially, but beneficially completely, covers the guideplate and seals it from above is additionally provided, if only to prevent the introduction of particles or contaminants. Advantageously, the inwardly facing surface of the cover, like the inwardly facing bottom surface of the guideplate, is as flat and smooth as possible, in order to make possible an undisturbed passage of the fluid and also of the wafers transported. The height of the enclosed space or the distance of the cover from the bottom surface of the guideplate depends on the desired flow rates and the thickness of the wafers to be transported. A value corresponding to about three times the wafer thickness has proved to be a guide value for the minimum necessary height, for example, in the transportation of semiconductor wafers by means of aqueous media, but this is not to be understood in the sense of a limitation, the preferred values being in the range of from about 2.5 to 15 mm. At the same time, the height does not need to be kept constant over the entire length of the guideplate, but may optionally also be reduced or increased. A cover for the system also has the advantage that it can likewise be provided with nozzles, and this has proved beneficial to an equal extent in all regions of the guideplate.

In principle, gases or liquids which possess, chemically, the desired reactive or inert properties and have a suitably low viscosity for adjusting the flow conditions needed can be used as fluids. For cost reasons alone, compressed air, optionally in a form with low particle concentration, is preferably used as gas, provided pure or super pure gases such as nitrogen, argon or helium are not necessary for cleanliness reasons. In the case of liquids, which are in general used in preference to gases, aqueous media, i.e., water and/or aqueous solutions which may contain, for example, chemical reagents or rinsing or cleaning agents, are used with particular advantage.

The arrangement of the nozzles in the plate bottom which release the fluid used in a particular case into the interior of the guideplate is of particular importance. Hereinafter, the nozzles effecting a movement of the wafer-type workpieces to be transported in the planned direction are described as feed nozzles, the nozzles effecting a slowing down of said movement as retardation nozzles, and the nozzles effecting a rotation of the workpiece as rotation nozzles. The geometrically ideal inner bottom surface of the guideplate is used as a reference plane, but in this connection, any minimum unevenness present in the real surface should be left out of consideration. The direction of transportation is understood to mean that the direction in which the center of gravity of the wafer-type workpiece moves across the guideplate, if transportation proceeds in an ideal and undisturbed manner. As a rule, the direction of transportation extends essentially parallel to the longitudinal axis of the guideplate.

Expediently, the nozzles provided in the plate bottom and, optionally, also in the cover, are combined to form groups which are, in each case, supplied with the fluid, in particular, the aqueous medium via a common supply channel. The arrangement of the nozzles then follows the particular supply channels which extend linearly as much as possible, since they can then be installed most easily in the guideplate, which is optionally composed of two halves, for example, by drilling or milling. It is also beneficial to supply the feed, retardation and rotation nozzles via channels which are independent of one another, so that they are not simultaneously and permanently fed, but can be supplied with fluid when necessary.

The shape and inside width of the nozzles depend essentially on the fluid medium used in a particular case and is expediently optimized in preliminary experiments for the desired transportation conditions. In the case of the preferred aqueous media, for example, nozzles with a round cross section and diameters in the range of from about 0.1 to 5 mm, and advantageously, about 0.5 to 1.5 mm, have proved successful, the lower limit being determined, as a rule, by the viscosity of the media and the size of the particles it contains, and the upper limit ultimately by the available pump output and the still acceptable flows. Instead of nozzles having round cross sections, it is also possible to provide ones with oval, square, rectangular or slit-type cross sections. Generally, it is also possible to influence the emergence characteristic of the medium through the design of the outlet opening and to provide, for example, full, scattered or spray jets or appropriate mixed types.

It is also important to safeguard the various fluid supply systems as far as possible against pressure variations. This can be achieved, for example, with the aid of pressure regulators or buffers. Generally, it is possible to achieve good results in the case of aqueous, as in the case of gaseous, media with operating pressures of about 200 to 500 kPa. The pressure needed can be produced, for example, by means of commercial pumps or high-level reservoirs.

The individual feed nozzles are arranged in the plate bottom of the guideplate in a manner such that they are situated in each case in a plane which is essentially perpendicular to the plate bottom, and essentially parallel to the direction of transportation, it also being possible to provide deviations from this ideal orientation, provided the resulting moments interact in a manner such that they are directed essentially in the direction of transportation. In principle, however, arrangements are also not excluded in which the plane, viewed in the direction of transportation, includes an acute angle with the latter, so that the fluid jet emerging from the nozzles is essentially identically directed from the outside at an angle to the longitudinal axis of the guideplate and to the direction of transportation. The use of mixed types which have feed nozzles aligned both at an angle in this manner and also parallel to the direction of transportation is, at the same time, not excluded either.

Viewed in the direction of transportation, the nozzles form an acute angle with the plate bottom, and to be specific, advantageously between about 30° and 60°, preferably, about 45°. Preferably, an arrangement is provided for the nozzles, in which they form a plurality of rows which extend parallel to the direction of transportation or the longitudinal axis of the guideplate, and have different or, beneficially, equal spacings from one another, and in which they are arranged consecutively with varying or, beneficially, equal spacing. Nozzles corresponding to one another in the various rows are advantageously incorporated in the bottom plate in a manner such that they develop an essentially linear front, although, in principle, a curved extension of the front is also not excluded.

The retardation nozzles provided, according to the invention, in the plate bottom are preferably also arranged in a manner such that they are situated in a plane which is essentially perpendicular to the plate bottom, and which extends essentially parallel to the direction of transportation, it also being possible to provide deviations from this ideal orientation, provided the resulting moments interact in a manner such that they are directed essentially in the direction of transportation. In principle, however, arrangements are also not excluded in which the plane, viewed in the direction of transportation, includes with the latter, an obtuse angle, so that the fluid jet emerging from the nozzles is, in each case, directed from the outside at an angle to the longitudinal axis of the guideplate, and essentially, in opposition to the direction of transportation. At the same time, the use of mixed types which have retardation nozzles aligned both at an angle in this manner and also parallel to the direction of transportation, is also not excluded.

The retardation nozzles are aligned in an inclined manner relative to the plate bottom, and to be specific, the angle of inclination, viewed in the direction of transportation, is about 90° to 170°, preferably about 120° to 150°, and beneficially, about 135°, so that the retardation nozzles are, therefore, ultimately inclined in opposition to the direction of transportation. As in the case of the feed nozzles, an arrangement is also provided for the retardation nozzles, in which they form a plurality of rows which extend parallel to the direction of transportation or the longitudinal axis of the guideplate and are differently or, beneficially, equally spaced from one another, and within which they are arranged consecutively with varying or, beneficially, equal spacing. Nozzles corresponding to one another in the various rows are advantageously incorporated in the bottom plate in a manner such that they develop an essentially linear front, although in principle, a curved extension of the front is not excluded. At the same time, it is not mandatorily specified that all the retardation nozzles have the same angle of inclination; arrangements are also conceivable in which the nozzles within a row are aligned with different angles of inclination and, for example, go over from a virtually or exactly perpendicular position to a more considerably inclined one, it also being possible for this transition to take place in stages. Beneficially, the rows of retardation and feed nozzles are, in each case, arranged in one line.

BRIEF DESCRIPTION OF THE DRAWINGS

Examples of possible arrangements of the feed and retardation nozzles and also, optionally, of the rotation nozzles additionally present are explained below with reference to FIGS. 1 and 2, as possible embodiments of processes for the wet-chemical surface treatment of semiconductor wafers using the proposed devices. In this connection.

Components corresponding to one another are provided with the same reference numerals in the figures.

DETAILED DESCRIPTION OF THE PREFERRED EMBODIMENTS

Figure 1A:
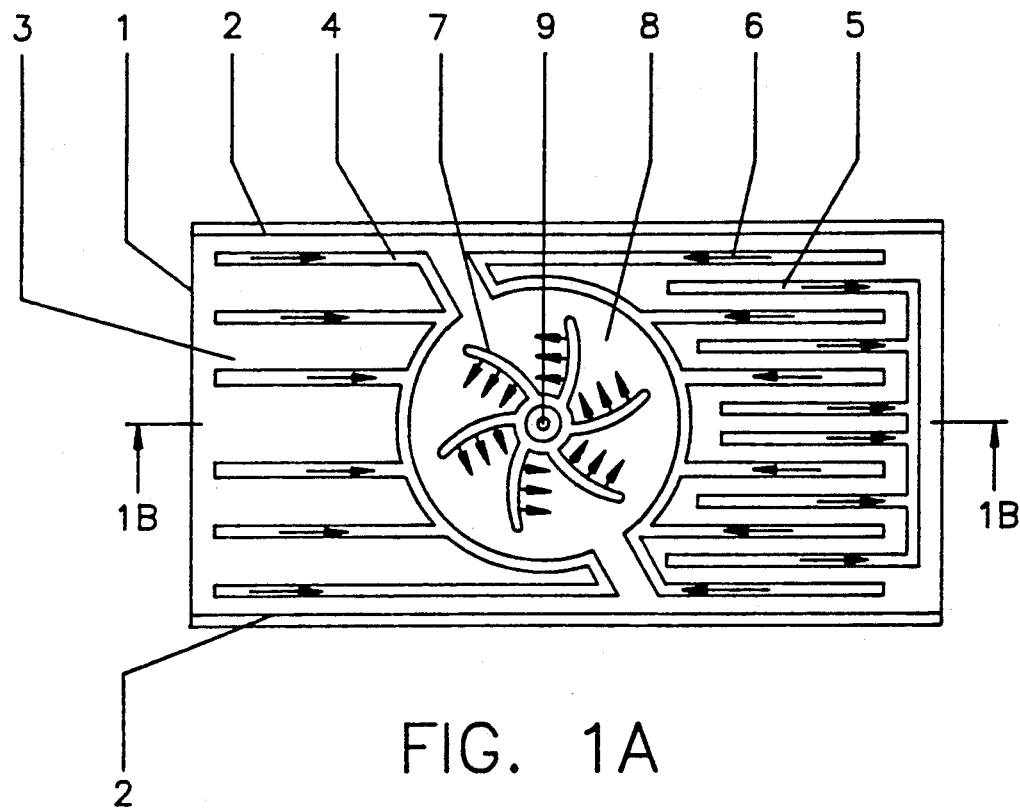
FIG. 1A is a schematic plan view of a guideplate having feed, retardation and rotation nozzles in a plan view and an idealized longitudinal section.
Figure 1B:
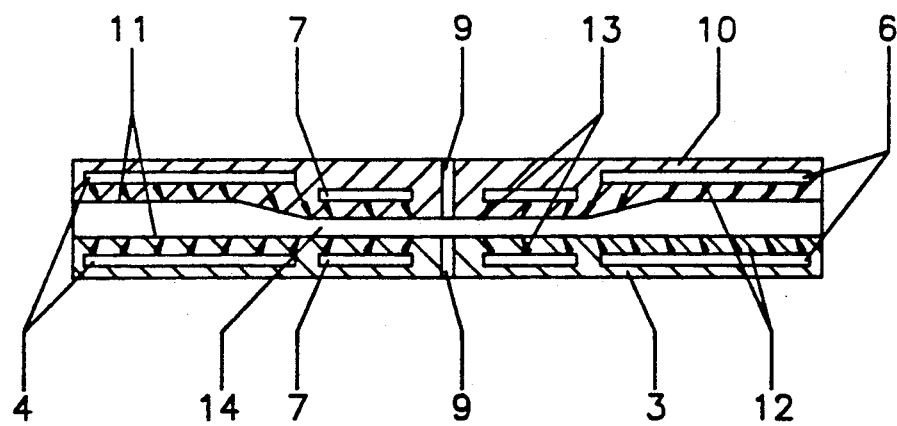
FIG. 1B is a cross-sectional view of the guideplate of FIG. 1A, taken along line 1B—1B thereof.

Referring to the drawings, in detail, and initially to FIGS. 1A and 1B, there is shown a guideplate 1 made, for example, of polymethyl methacrylate ("Plexiglass") and having lateral walls 2. Incorporated in the flat bottom 3 of the plate are supply channel systems 4, 5, 6 and 7, which are independent of one another. It is, therefore, possible for feed nozzles 11 to be supplied with, for example, aqueous medium via channel systems 4 and 5, retardation nozzles 12, via channel system 6, and rotation nozzles 13, which are present in the device shown and are advantageous, but are not mandatory, via channel system 7. For reasons of clarity, the individual rows of nozzles emerging from the channel systems are shown only schematically, with the arrows in or beside the channel systems, indicating the main direction in which the medium flowing out of the nozzles travels. The transport direction, which is not specifically indicated, runs parallel to the longitudinal axis of the guideplate from left to right.

According to a preferred embodiment of the invention, there is provided, in the region of the guideplate in which the transported wafer comes to a halt through the action of retardation nozzles 12, an additional rotation region 8 in which the wafer can be caused to rotate during or after the retardation. The rotation nozzles 13 provided in this region (shown here only schematically for reasons of clarity), advantageously follow, in their arrangement, lines which emerge radially from a common center, which essentially also corresponds to the center of the wafer rotation. These lines may be straight, but are preferably curved, and advantageously follow circular lines, but may also be elliptical, parabolic or hyperbolic curve sections, the centers of the curves being situated, in each case, in the planned direction of rotation. Expediently, supply channel system 7, via which the ultimately released fluid is provided, also follows this route chosen for the arrangement of rotation nozzles 13 in the manner shown in FIG. 1, although systems of different design, for example, in the form of annular channels, are also not excluded in principle.

At least 3, and advantageously, 4 to 10, of such rows of rotation nozzles 13 originating from a common center and following the preferably curved route chosen in each case, are necessary for a reliable wafer rotation. Preferably, this arrangement has rotational symmetry relative to the common center. It has also proved beneficial if nozzles corresponding to one another in these rows are in each case situated on concentric circles relative to the common center. In this connection, it has proved particularly satisfactory if the difference in the radii of adjacent concentric circles does not remain constant, but decreases from the inside towards the outside, so that the distance of adjacent nozzles from one another eventually decreases from the inside towards the outside within a series of nozzles.

Beneficially, the area of rotation region 8 fitted with rotation nozzles 13 approximately corresponds to the surface of the transported wafer-type workpiece. It has proved advantageous, especially in relation to the positional stability of the rotating wafer, if the outermost rotation nozzles 13 are arranged in such a way that they are still inside the area swept over by the wafer during the rotational movement. Beneficially, the distance of, in each case, the outermost rotation nozzles 13 of a series of nozzles from the common center is about 60% to 95% of the wafer radius.

Rotation nozzles 13 are expediently situated in each case in planes perpendicular to the plate bottom of guideplate 1, it being possible for deviations of about ±5° from the precisely perpendicular orientation to still be tolerated. These planes cut the lines, along which the nozzles emerging from the common center are arranged, at a right angle, deviations of ±5° again still being permissible. Consequently, if rotation nozzles 13 are situated on straight lines, these planes are aligned essentially parallel. If the series of rotation nozzles 13 form curved lines, for example, circular lines, the planes intersect one another, if ideally aligned, in a straight line which extends perpendicular through the center of curvature. In practice, however, the deviations from the ideal alignment are still permissible. It has furthermore been found that the wafers are particularly insensitive to deflections during the rotation if the centers of curvature of the lines of rotation nozzles 13 in a particular case are situated outside the circumference of the wafer.

Rotation nozzles 13 are tilted in the direction of rotation, the angle of inclination relative to the plate bottom viewed in all cases in the direction of rotation, being about 10° to 80°, and preferably about 30° to 60°, and beneficially, about 45°.

In order to prevent undersupplied regions being produced in the center of the wafer due to centrifugal forces, in particular, in wet-chemical treatments of the rotating wafers, a central supply tube 9 can be provided in which the medium used, in a particular case, and in particular, an aqueous medium, can also additionally be applied centrally to the wafer from below and/or above. Surprisingly, it was found in this connection, as a result of tests with colored solutions, that with wafers rotating in the device according to the invention, no entrainment of medium applied to the top of the wafer to the bottom of the wafer, and vice versa, can be observed, and this is of importance, for example, in the cleaning of semiconductor wafers.

If a rotation region is provided in the device according to the preferred embodiment, the fronts between feed nozzles 11 and retardation nozzles 12 expediently do not extend perpendicular to the direction of transportation, but at an angle, those nozzles for which the direction of emergence of the fluid coincides with the planned direction of rotation being displaced in each case relative to the perpendicular extension of the fronts. With this arrangement, which is also achieved in the peripheral region in the arrangement shown in the figures, a moment of momentum which acts on the wafers and which, on the one hand, facilitates the rotation and, on the other hand, also promotes the rapid positioning of the wafer in the rotational position, is produced even during the retardation process. In this case, rotation region 8 does not, however, necessarily also have to be equipped with feed or retardation nozzles since, with the preferred use of aqueous media, the quantity of liquid released by the surrounding nozzles is found by experience to support the wafer even without rotation nozzles 13 already being in operation. However, overlapping regions in which the front extends through rotation region 8 between feed and retardation nozzles 11 and 12 are also not excluded, for example, if wafers having large diameters of, for example, about 20 cm and above are to be transported, retarded and caused to rotate.

In the case of overlapping regions or for arrangements without a rotation region 8 in which the wafer is only retarded, the fronts of feed nozzles 10 and retardation nozzles 12 advantageously extend precisely or essentially parallel to one another. In that case, either a straight extension of the front, for example, directed at right angles or at an angle to the longitudinal axis of the guideplate, or a curved extension of the front is suitable, for example, if a type of collection position is provided with a circularly or parabolically drawn-back central section of the retardation nozzle system.

The longitudinal section diagram of FIG. 1B, taken along the line 1B—1B thereof, schematically shows an arrangement which is provided, in accordance with the preferred embodiment, with a cover 10. Incorporated both in plate bottom 3 and also in cover 10 are supply channel systems 4, 6 and 7, which are independent of one another, and which supply upper and lower feed nozzles 11, which are inclined in the direction of transportation, and upper and lower rotation nozzles 13, which are inclined in the direction of rotation, with an aqueous medium. At the same time, an approximately mirror-image arrangement of the nozzle systems, in particular of retardation nozzles 12, in cover 10 and in plate bottom 3 has proved successful, although other arrangements, for example, arrangements alternating in zip-fastener fashion, are also not excluded. In principle, the channel systems in cover 10 and in plate bottom 3 can be offset relative to one another, or the nozzles may be arranged at different angles of inclination.

To achieve a uniform action of the media used in a particular case on the front and back of the wafer during the rotation, it has proved beneficial to provide, in the rotation region, a constriction 14 in which cover 10 approaches plate bottom 3 and consequently, reduces the flow height. Advantageously, constriction 14 is produced by bevelling cover 10 on the input and output side until the planned distance from plate bottom 3, which typically corresponds to about 3 to 5 mm, is reached. Expediently, the deviation from the horizontal is kept small in the region of the bevelling; in most cases, values of up to about 10° have proved successful, it optionally being possible for the edges to be rounded in the transition regions from and to the horizontal.

The various nozzle systems do not need to be permanently and continuously in operation. Control systems in which control pulses initiated by the wafers passing through, advantageously set the necessary nozzle system in operation in each case, and are preferably provided simply to keep the consumption of fluid low. If, for example, a wafer and in particular a semiconductor wafer, enters the device, only feed nozzles 11 fed via the supply channel system 4 are beneficially set in operation at first in order to allow the wafer to advance into the interior. When a particular position is reached, which may be monitored, for example, by means of an optical sensor, retardation nozzles 12 are likewise set in operation via supply channel system 6, so that a flow is developed which is opposed to the fluid flow formed by feed nozzles 11. The advancing movement of the wafer slows down on entering the countercurrent region to an ever increasing extent until the wafer eventually stops and has reached the rotation position. Now, the rotation nozzles 13 are switched on, advantageously under sensor control, and the wafer begins to rotate with increasing speed. For example, with devices designed analogously to that in FIG. 1A, it was possible to achieve rotational speeds of about 60 rpm with silicon wafers having a diameter of approximately 20 cm. In this case, water was used as fluid and the pressure was about 450 kPa.

After the planned rotation time has elapsed, the fluid supply through rotation nozzles 13 and retardation nozzles 12 is interrupted, while feed nozzles 11 in guideplate 1, which are not yet in operation are set in operation, so that all feed nozzles 11, that is to say, those fed via supply channel systems 4 and 5, are in operation. As a result, the wafer again starts to move in the direction of transportation and finally leaves guideplate 1. Expediently, the fluid supply via supply channel system 5 can then again be terminated by means of a sensor control, while a further wafer can be introduced and transported on the input side. In principle, the control can also be carried out manually, for example, during experimental operation or in optimizing the operation parameters.

It has also proved advantageous if at least one liquid retainer to be passed through by the wafers is provided on the device on the input and/or output side, for example, in order to be able to remove any residue of liquids, reagents or particles still adhering from the previous treatment stage, or alternatively, in order to keep the risk of an entrainment of fluid residue from the device to the subsequent treatment stage low. The retaining action can be achieved, for example, with the aid of liquid curtains or jets which have the appropriate width to be able to act on the entire wafer surface which is passed through. In this process, the retaining effect results from the relative speed between the wafer passing through and the liquid curtain or jet. Optionally, a plurality of liquid retainers arranged in series may also be provided. Preferably, such liquid retainers are fed with the medium used in the device in a particular case.

A particularly low entrainment of aqueous solutions, with the transported wafer outwards from the device, can be achieved if there is provided downstream of at least one, advantageously, the last liquid retainer, a drying zone in which a flow of gas, for example, of heated or unheated air or nitrogen, is passed over the surface of the emerging wafer. It has been found that, after passing through such a combination of a retainer and a drying zone, preferably employing heated air, the wafers transported through the device according to the invention exhibit only surprisingly small traces of particles and the same applies to the aqueous media which have previously been used as the fluid for transportation, retardation and, optionally, rotation. Such combinations of guideplate 1 with retainer and drying zones can, in turn, again be combined with one another or arranged in series, so that entire treatment lines can eventually be constructed in which the wafers pass consecutively through devices fed with varying fluids and are consequently, for example, etched, rinsed, cleaned or subjected to other wet-chemical treatment steps in succession.

Figure 2:
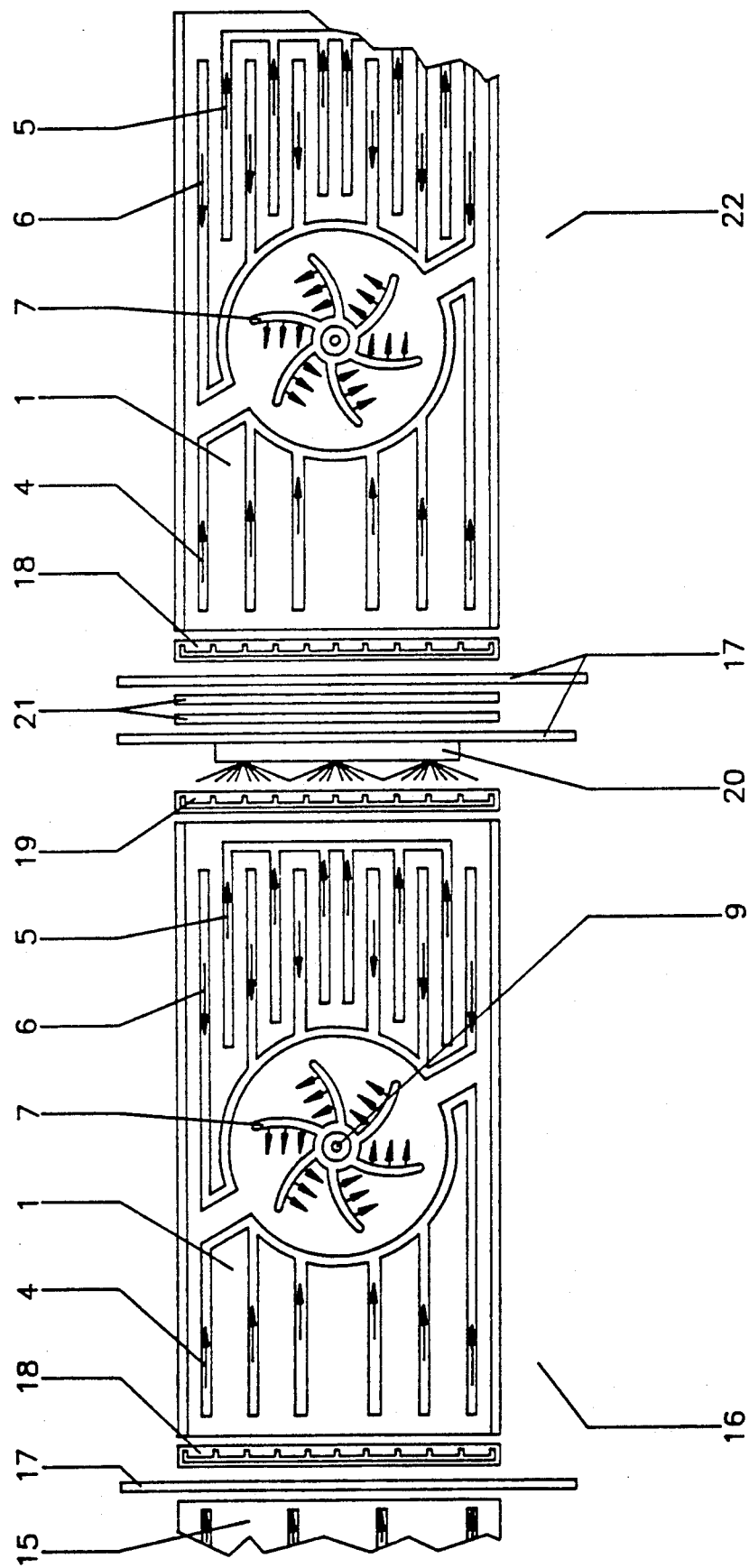
FIG. 2 is a schematic plan view of a section of a treatment line with devices arranged in sequence for wafers to be treated and passed through consecutively.

FIG. 2 shows a possible section of such a treatment line. It shows, first of all, a starting position 15 in which the wafers can be presented, for example, in a processing tray and can be unloaded, for example, by means of water or air nozzles. The wafers then enter a first treatment station 16 which is situated, for example, in a bath 17 which is indicated only schematically and which serves to collect the quantity of liquid emerging in this station. The wafer is first brought up to speed with the aid of loading nozzles 18 and then enters guideplate 1 of the actual device in which it is transported, retarded, rotated and transported further, in the manner already explained. After leaving guideplate 1, the wafer acquires yet a further movement momentum form unloading nozzles 19 and then passes through a liquid retainer 20 and a separating zone 21, designed for example as a drying zone, and enters a second treatment station 22 which is basically analogous in construction to the first and may be fed with the same or a different fluid. As many further treatment stations as desired can be joined in accordance with this principle. With particular advantage, various aqueous media such as, for instance, pure water, acidic solutions, solutions containing surfactants or oxidizing solutions can be used as fluids in the various stations. In the separating zones 21, treatment steps such as, for example, washing, rinsing or neutralization operations can also be carried out, in addition to, or instead of, a drying of the wafer.

Such devices are consequently particularly suitable for processes for wet-chemical surface treatment of wafer-type workpieces, and in particular, semiconductor wafers, in which one or more liquid phases are caused to act on the wafer surface and the wafers are subjected at least to one transportation operation by means of fluid media. In such processes, a device according to the invention can be used in a particular case only in one treatment step or in separate treatment steps, that liquid being used as a fluid medium, which is also intended to act on the wafer surface in the particular processing stage. According to the preferred embodiment, however, a plurality of devices, and at least two devices, are arranged in series, in the manner described above, and are used in such processes. In that case, different liquids are used as a fluid medium from station to station, the wafers passing through a rinsing and drying zone, beneficially in the form of a washing curtain and a dry gas flow, when passing from station to station, and thus being largely freed from the liquid used in the preceding station. In this process, preferably aqueous media are used as fluids, and to be specific, all the solutions at present known for the wet-chemical surface treatment of semiconductor wafers in the framework of the final cleaning process may, for example, be used.

The particular advantage is that an aqueous medium of a certain composition is always used in a treatment station in each case, so that a contamination due to changes in reagents can be eliminated, the risk of an entrainment into subsequent treatment stations is low and the preparation of the aqueous media and a possible reuse or a circulation within the treatment station are possible. Furthermore, no mechanical contacts or transportation operations employing mechanically moving parts are necessary, even for a plurality of sequential treatment steps involving different solutions, any more than they are necessary for the retardation and rotation of the wafer. In addition, the wear of the hydraulic constructional and drive elements needed for operation is low and the pressure ranges needed are easy to control, so that, compared with devices and processes carrying out mechanical transportation steps, more beneficial service lives are also achieved in addition to cleaner products, that is to say, in particular, semiconductor wafers.

What is claimed is:

1. A process for the wet-chemical surface treatment and/or cleaning of wafer-type workpieces, comprising the steps of:

causing at least one liquid to act on a wafer surface for said wet-chemical surface treatment and/or cleaning;

subjecting the wafers to at least one transportation operation by means of said at least one liquid media; and passing the wafers through at least one device including a guideplate having lateral walls and a plate bottom defining a transportation space including a retardation region and a rotation region; feed nozzle means arranged in said plate bottom and inclined in the direction of transportation, for forcing said at least one liquid into the transportation space; and retardation nozzle means arranged in the guideplate at an angle inclined in opposition to the direction of transportation, for supplying said at least one liquid to said retardation region; and rotation nozzle means arranged radially from a common center in the guideplate at an angle inclined in the direction of rotation, for supplying said fluid media to said rotation region.

2. The process as claimed in claim 1, further including the step of passing the wafers through at least two said devices arranged in sequence, different liquids being used from device to device, and freeing the wafers at least partially from the liquid used in the preceding device in a retaining and drying zone on passing into the next device.

* * * * *